United States Patent [19]
Campe et al.

[11] Patent Number: 5,380,372
[45] Date of Patent: Jan. 10, 1995

[54] SOLAR CELL AND METHOD FOR MANUFACTURE THEREOF

[75] Inventors: Hilmar V. Campe, Bad Homburg; Horst Ebinger, Salmünster; Dieter Nikl, Kelkheim; Wolfgang Warzawa, Hanau, all of Germany

[73] Assignee: Nukem GmbH, Alzenau, Germany

[21] Appl. No.: 958,090

[22] Filed: Oct. 8, 1992

[30] Foreign Application Priority Data

Oct. 11, 1991 [DE] Germany ............................. 4133644

[51] Int. Cl.6 .................. H01L 31/0392; H01L 31/18; H01L 31/0368
[52] U.S. Cl. ........................................ 136/258; 437/4; 437/967; 257/49; 257/75
[58] Field of Search ................... 136/258 PC; 257/49, 257/75; 437/4, 100, 109, 186, 233, 248, 967; 156/620.7, 620.71

[56] References Cited

U.S. PATENT DOCUMENTS

| | | | |
|---|---|---|---|
| 4,077,818 | 3/1978 | Chu | 437/2 |
| 4,137,355 | 1/1979 | Heaps | 428/201 |
| 4,313,254 | 2/1982 | Feldman et al. | 437/4 |

OTHER PUBLICATIONS

Extended Abstracts vol. 80–1 No. 332, May 1980, Princeton, N.J. pp. 827–828 G. A. Van der Leeden et al. "The recrystallization of silicon on graphite".

*Primary Examiner*—Aaron Weisstuch
*Attorney, Agent, or Firm*—Cushman, Darby & Cushman

[57] ABSTRACT

The invention relates to a semiconductor component such as a thin-film solar cell with a seeding layer (20) arranged between a semiconductor layer (21, 22) and a carrier substrate (18). The surface of the carrier substrate (18) facing the seeding layer (20) is sealed or a sealing layer (19) is deposited onto the carrier substrate (18).

26 Claims, 7 Drawing Sheets

FIG. 1
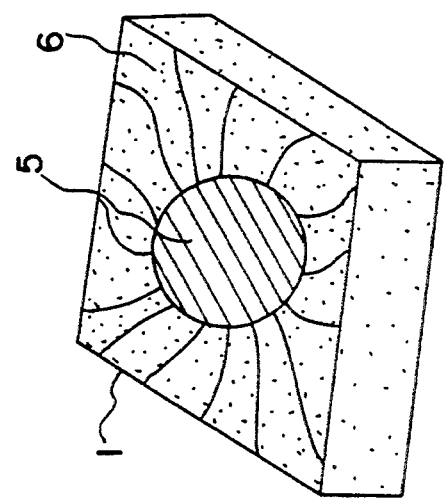
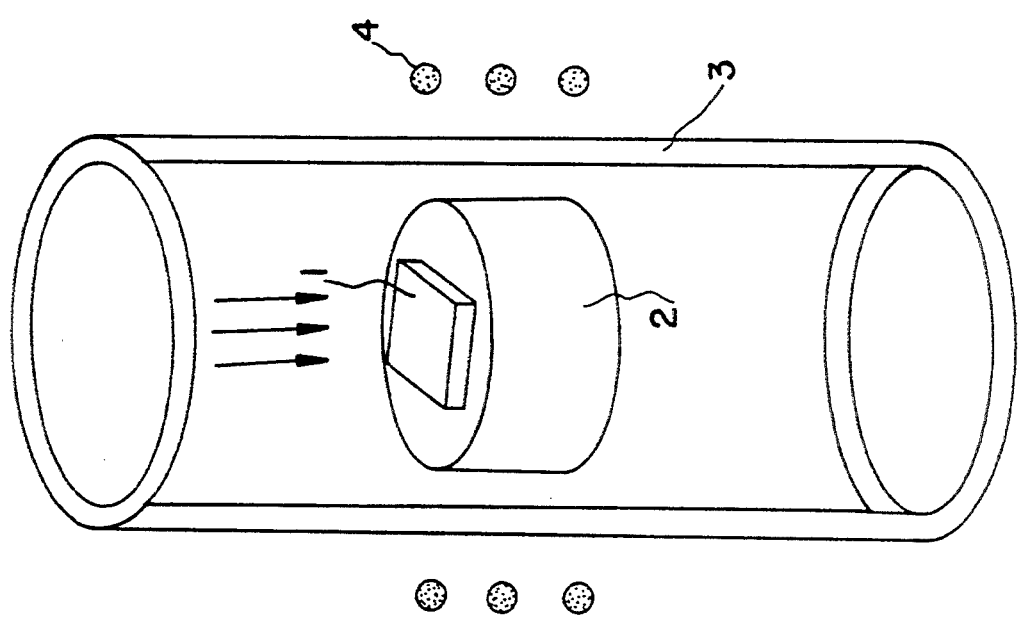

FIG. 3
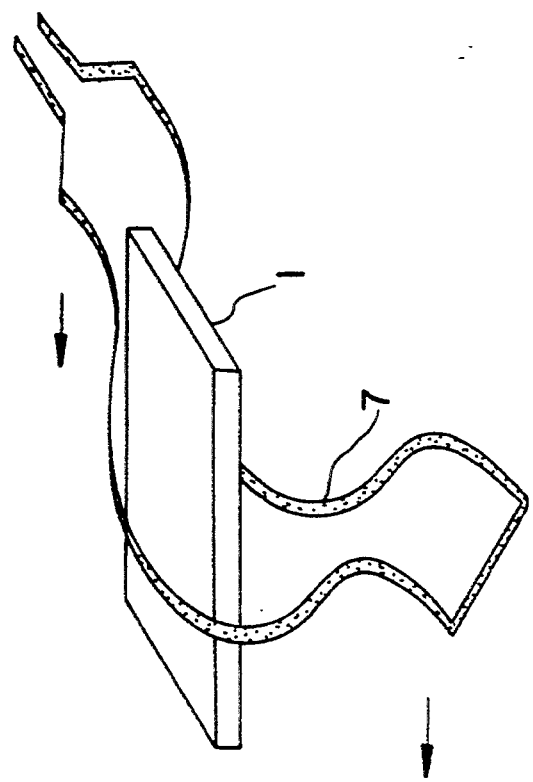
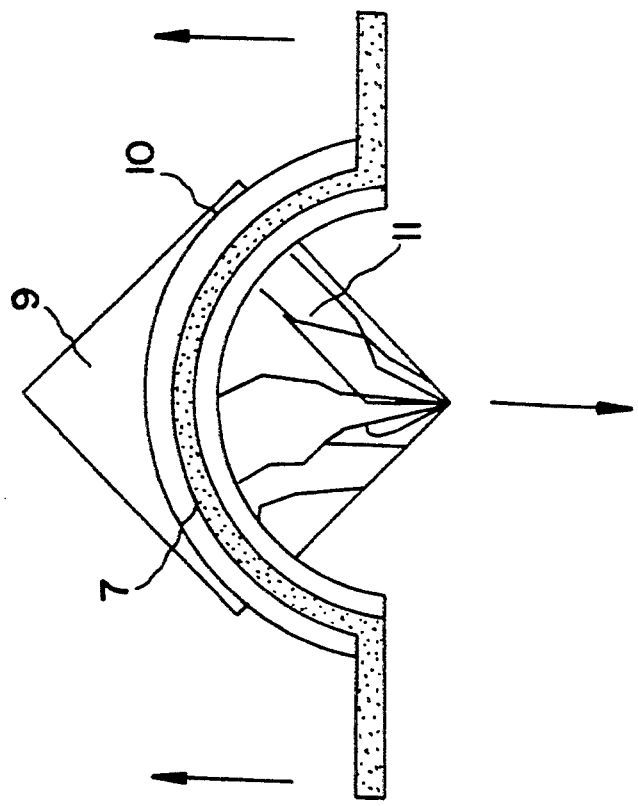

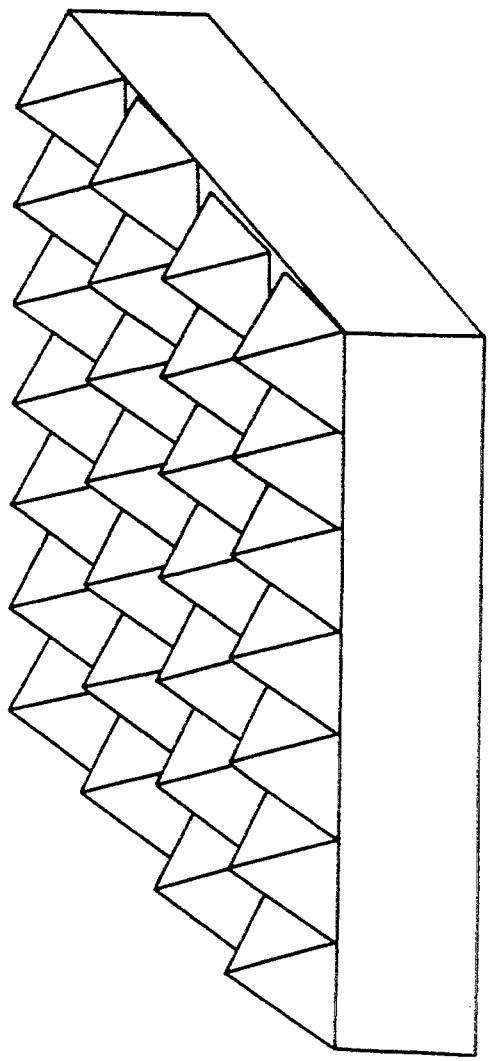

SOLAR CELL AND METHOD FOR MANUFACTURE THEREOF

FIELD OF THE INVENTION

The invention relates to a semiconductor component, in particular to a thin-film semiconductor component such as a thin-film solar cell, comprising a substrate, first and second electrically conducting contacts forming front and rear contacts respectively, at least one semiconductor film between these contacts, and a nucleation film disposed between the semiconductor film and the substrate and having a thickness preferably of up to 10 μm. Furthermore, the invention relates to a method for manufacture of a semiconductor component, in particular a thin-film semiconductor component such as a thin-film solar cell comprising a substrate, first and second electrically conducting contacts forming front and rear contacts, respectively, at least one semiconductor film or layer between these contacts, and a nucleation film or layer disposed between the semiconductor film and the substrate, this nucleation film or layer being initially applied and then melted, and then laterally crystallized, with the semiconductor film or layer then being epitaxially deposited onto the nucleation film or layer. Finally, the invention relates to an apparatus for manufacture of a suitable semiconductor component.

BACKGROUND OF THE INVENTION

To manufacture large-area semiconductor components, in particular solar cells or thin-film transistor arrays, a cost reduction is aimed at by establishing an economical manufacturing process. This is attempted by depositing the semiconductor substance in the form of a thin film on inexpensive substrates. In the case of amorphous silicon as the semiconductor film, considerable efforts have been made, but despite successes, the problem of stability of the components is still only unsatisfactorily solved.

As an alternative, there is the possibility of depositing polycrystalline silicon on a substrate in the form of thin films. It is expected that this will largely eliminate any stability problems.

In conventional crystalline silicon solar cells the silicon wafer thickness is greater than 200 μm in order to avoid minority carrier recombination at the rear contact and effective absorption of the sunlight.

Götzberger, *Proc. 15th IEEE Photovolt. Spec. Conf.*, 1981, Kissimee, Fla., USA, p. 867, shows a way of achieving an efficient light absorption, even with film thicknesses of 5–20 μm, using a diffuse rear reflector. Knobloch, Voss and Götzberger, *Proc. 16th EC Photovolt. Solar Energy Conf.* Apr. 15–19, 1985, London, p. 285, calculate a theoretically possible efficiency of 25% for a crystalline thin-film solar cell.

In order for the light-generated charge carriers reach the electrical field of the semiconductor element (in particular the solar cell), the diffusion length of the base material must be sufficiently high.

In the calculations of Knobloch, Voss and Götzberger, it is shown that diffusion lengths $L_D = 50$ μm for film thicknesses of 20 μm, $L_D = 30$ μm for film thicknesses of 10 μm, and $L_D = 20$ μm for film thicknesses of 5 μm are necessary to achieve a good collection efficiency. Since recombination centers form at the surfaces and grain boundaries in polycrystalline silicon, two conditions must be met for good functioning of a thin-film solar cell to be achieved: firstly, a good passivation of the boundary surfaces (surface passivation, in particular rear face passivation), and secondly, grain boundary passivation or large grains with $G = 2 - 4 \cdot L_D$ ($G$ = grain size). From the above are obtained the requirements for a grain size of 100 μm–200 μm for polycrystalline silicon in the thin-film solar cell and for an effective and stable passivation of the grain boundaries. In addition, the grain boundaries must be aligned perpendicularly to the substrate surface.

In addition, the front and rear faces of the cell must be passivated by suitable measures.

The practical achievement of this concept encounters difficulties of a fundamental nature, since the high nucleation rate results in columnar and fine-grained growth during the deposition of thin crystalline silicon films on non-monocrystalline substrates.

The methods frequently described in the literature for deposition of silicon films, such as electron beam evaporation, P. H. Fang, C. C. Schubert, J. H. Kinnier and Dawen Pang, *Appl. Phys. Lett.* 39 (1981) 256; Charles Feldmann, N. A. Blum and F. Satkiewicz, Proc. 14th *IEEE Photovolt. Spec. Conf.* 1980, San Diego, p. 391; R. J. C. van Zolingen and A. H. Kipperman, *Thin Solid Films*, 58 (1979), and thermal CVD methods by reduction of various chlorosilane compounds with hydrogen at temperatures of 1100°–1300° C., lead to growth of grains of max. 20–30 μm size.

By long tempering at higher temperatures, a certain degree of recrystallization in silicon films can lead to the formation of larger grains, C. Daey Ouwens and H. Heijligers, *Appl. Phys. Lett.* 26 (1975) 579. In this case, grain sizes of up to 100 μm are achieved, but only with tempering times of 10 hours and at temperatures of more than 1350° C. Under these conditions, heavy diffusion of impurities from the substrate into the silicon film must be expected, which is detrimental to the quality of the solar cell.

Considerably larger crystals are obtained by epitaxially depositing silicon films onto multicrystalline silicon wafers with millimeter grain size, T. Warabisako, T. Saitoh, H. Itoh, N. Nakamura and T. Tokuyama, *Jpn. J. Appl. Phys.*, 17 *Suppl.* (1978) 309; P. H. Robinson, R. V. D'Aiello, D. Richman and B. W. Faughnan, *Proc.* 13*th IEEE Photovolt. Spec. Conf.*, 1978, Washington D.C., p. 1111.

T. Warabisako et al., supra, use substrates made from polycrystalline silicon of metallurgical purity, of Czochralski type and sawn into 0.4 μm thick wafers. On these wafers, a 20–30 μm thick p-Si film is deposited by reduction of $SiH_2Cl_2$ with $H_2$ at 1100°–1150° C., followed by deposition of a 0.5 μm thick n+-doped Si film at 1000°–1050° C. A similar process is applied by P. H. Robinson et al., supra. In this process, however, the economic advantage is lost, since the silicon wafers must be manufactured separately.

T. L. Chu, S. S. Chu, K. Y. Duh and H. C. Mollenkopf, *J. Appl. Phys.* 48 (1977) 3576, employ as the basis for epitaxial silicon deposition a silicon film of approx. 200–500 μm thickness (p-doped, 0.002–0.004 Ω cm) on a graphite substrate. This film is generated by reduction of $SiHCl_3$ with $H_2$ To manufacture large grains, the films are melted and crystallized in a second process. An obstacle here is the high surface tension of silicon, which results in the melted material on the substrate contracting into droplets, thus interrupting the melt zone. However, by melting of a narrow zone, it is possible to get around this effect. The reactor comprises a quartz tube which is flushed with hydrogen and heated with a radio-frequency coil. The Si-coated substrate is passed underneath an inductively heated SiC-coated graphite rod (heater) located inside the reactor. The hot graphite rod radiates heat and ensures a melted zone that is 2 cm wider in the middle than at the edge of the substrate. After crystallization of Si films of this type, a solar cell is manufactured by epitaxially depositing a 20–30 $\mu$m thick p-conducting silicon film on the crystallized base, and then depositing a 0.2–0.4 $\mu$m thick n-conducting emitter film on top of it.

According to M. Kerber, M. Bettini and E. Gornick, Proc. 17th IEEE Photovolt. Spec. Conf., 1984, Kissimee, Fla., p. 275, a highly doped n-conducting Si film is first deposited on a graphite substrate and is then melted and recrystallized using a tungsten wire passed over it as a radiation heater. The optimum thickness of this film is given as 20–30 $\mu$m. The photovoltaic active n-conducting film with 60–100 $\mu$m thickness is now epitaxially deposited. An SIS solar cell with 9% efficiency is then manufactured by a subsequent spray pyrolysis of $SnO_2$.

Common to both methods is the fact that the heater for the melting zone in the reaction chamber is under inert gas ($H_2$). It is therefore necessary to interrupt the coating process during melting, otherwise the heaters in the reactor would become Si-coated.

The recrystallized silicon films described in both methods are too thick for manufacture of a thin-film solar cell as mentioned above from polycrystalline silicon of only 20–50 $\mu$m thickness. Also, the films do not have the necessary lattice perfection for a photovoltaically usable material, with the result that a very thick epitaxial film with the required photoelectrical properties must be deposited.

As a result, the economic advantage possible in principle with deposition from the gas phase is lost because:
1. a thick film has to be used to make large crystals, which however have too poor a lattice quality for photovoltaic purposes; and
2. a thick film has to be deposited onto it because there is no rear reflector to absorb the sunlight effectively.

Furthermore, our own tests with isostatically compressed, high-density graphite substrates (12% porosity) have shown that the graphite soaks up the silicon when it is melted thereon, so that thin silicon films disappear into the graphite and hence cannot be recrystallized. A thin-film solar cell cannot therefore be manufactured in this way.

Finally, DE-B 1 223 951 describes a method of manufacture of a semiconductor component with at least one pn-junction, in which a nucleation film is deposited onto a substrate by melting. The material of the carrier and/or impurities can diffuse into the semiconductor material so that the semiconductor component is not pure and stable when viewed in the long term.

OBJECT AND SUMMARY OF THE INVENTION

The object of the present invention is to manufacture a semiconductor component of high efficiency at low cost, while at the same time ensuring the long-term stability of the semiconductor component itself.

The object is achieved, in accordance with the invention, in that the surface of the substrate facing the monocrystalline or multi crystalline nucleation film or layer is sealed, or that an intermediate film or layer sealing the carrier is disposed between the nucleation film or layer and the substrate.

A method for manufacture of a semiconductor component, in particular a thin-film semiconductor component such as a thin-film solar cell, comprising a substrate, first and second electrically conducting contacts forming front and rear contacts respectively, at least one semiconductor film between these contacts, and a nucleation film disposed between the semiconductor film and the substrate, where the nucleation film is first deposited indirectly or directly onto the substrate and laterally crystallized, and the semiconductor film then epitaxially deposited onto the nucleation film, is characterized in that the substrate is sealed with an intermediate film before deposition of the monocrystalline or multicrystalline nucleation film, and the materials used for the intermediate film and the nucleation film are such that adhesion forces exist between the intermediate film and the nucleation film that are greater than the cohesion forces of the material forming the nucleation film.

Finally, an apparatus is proposed for manufacture of a semiconductor component, in particular a thin-film semiconductor component such as a thin-film solar cell comprising a substrate, electrically conducting front and rear contacts, at least one semiconductor film between these contacts, and a nucleation film disposed indirectly or directly on the substrate, where at least the nucleation film and preferably also the semiconductor film is depositable in a reaction chamber using the CVD method and the nucleation film is movable relative to a heat source for melting, characterized in that the heat source is a conducting loop emitting an electromagnetic radiation and being curved at least in that section facing the nucleation film in order to achieve a convex-shaped solidification contour in the nucleation film.

Further details, advantages and features of the invention are given not only in the claims and in the features they describe—singly and/or in combination—but also in the following description of a preferred embodiment as shown in the drawings.

BRIEF DESCRIPTION OF FIGURES OF DRAWING

In the drawings,

FIG. 1 is a sketch showing the principle of an array for manufacturing a semiconductor component;

FIG. 3 is an embodiment of heat sources for melting of a nucleation film;

FIG. 7 shows the texture of an epitaxial film of a semiconductor component.

DETAILED DESCRIPTION OF THE INVENTION

Figure 2:
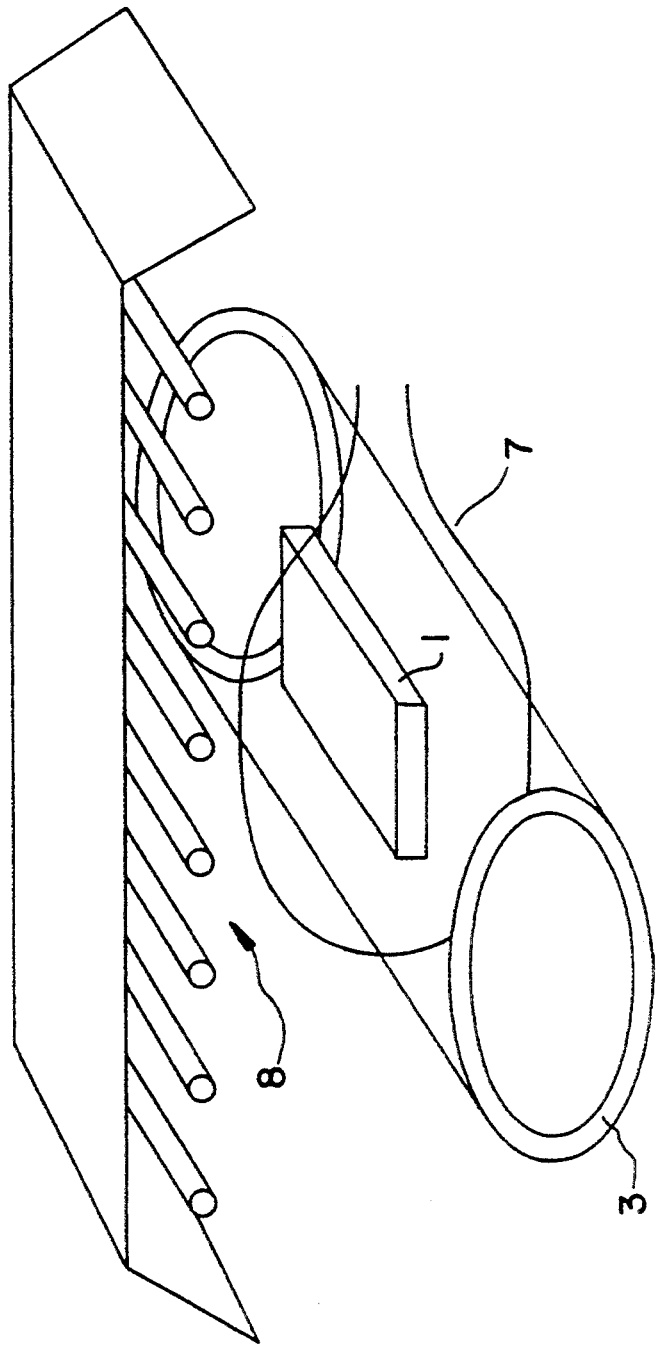
FIG. 2 is an alternative embodiment of an array for manufacturing a semiconductor component.

If a thin-film solar cell is to be manufactured in accordance with the invention, any substrate, preferably with a thermal expansion coefficient similar to silicon, can be used. Graphite is suitable.

A dense, fine-crystalline and electrically conductive intermediate film, preferably with a refractive index lower than that of silicon, is first deposited onto this substrate, in film thicknesses of 1 to 100 μm, preferably 10-60 μm. This intermediate film is used to seal the porous substrate such as graphite and at the same time is both an electrical rear contact and a diffuse reflector. Since metals react with silicon under the intended deposition conditions and form alloys, stable compounds are necessary as the film material.

Electrically conductive ceramic materials chosen from various metal boride, metal carbide, or metal nitride compounds are suitable for supplementing the SiC film, with the preferred compounds being those that contain elements of group III or group IV and no transition elements, since the latter lead to degradation of the solar cell by diffusion into silicon even in low concentrations.

Correspondingly doped silicon carbide (boron-doped or aluminum-doped SiC for p-conduction, nitrogen-doped or phosphorus-doped SiC for n-conduction) with a defined peak-to-valley height has proved particularly useful with silicon, with the silicon carbide representing a diffusely reflecting surface thanks to its surface structure. In view of the lower refractive index of SiC, total reflection occurs at the boundary surface Si/SiC when the light rays exit the silicon. This in turn leads to a diffusely reflecting Si/SiC boundary surface.

The doped SiC film can also contain correspondingly doped silicon. The SiC film can be made by the CVD method using heated substrates and methyl-trichlorosilane ($CH_3SiCl_3$) and hydrogen. Alternatively, a Si-containing chlorosilane ($SiHCl_3$, $SiCl_4$, $SiH_2Cl_2$) or $SiH_4$ and methane can be used, also in combination, instead of $CH_3SiCl_3$.

To achieve p-conduction, small quantities of dopant gas are added, for example $BCl_3$, $BBr_3$, $B_2H_6$ for boron doping, or aluminum compounds such as $AlCl_3$ or $Al(CH_3)_3$ for aluminum doping.

To achieve n-conduction, $NH_3$ or $N_2$, or $PH_3$ or $PCl_3$ can be used as the dopant gas.

In order to then deposit a semiconductor film with large monocrystalline areas on the substrate with the fine-crystalline intermediate film, the following process steps are selected.

Firstly, a thin and continuous nucleation film is deposited using any manufacturing method, preferably a thermal CVD method (reduction of $SiHCl_3$ or $SiCl_4$ in $H_2$ at 900°-1350° C.).

The nucleation film is then melted—at least in parts——and slowly solidified with a temperature gradient parallel to the substrate surface or converging on the substrate.

As a result, a Si nucleus forms at some point on the surface and grows laterally over the seeding film during cooling, so that a large grain of low film thickness can be manufactured in this way.

Once the nucleation film has completely or partially solidified, a photovoltaically suitable film can be deposited epitaxially onto the nucleation film at a lower temperature.

It is important to ensure here that the molten nucleation Si film does not form droplets, as silicon tends to do so. This problem is encountered particularly with high film thicknesses. The problem is solved by making the nucleation film so thin that the adhesion forces of Si and the intermediate film material exceed the cohesion forces in the Si droplet.

The SiC intermediate film is suitably wetted by silicon. (During manufacture of silicon droplets on a polished SiC film, a contact angle of 4°-6° was measured as evidence of good wetting.)

The droplet-forming effect of the surface tension in liquid silicon can be compensated with suitable structuring of the intermediate film surface by creating microscopically small cavities or depressions to act as capillaries for the liquid silicon. This can be achieved in a particularly simple manner by roughening the wettable intermediate film, for example in a SiC intermediate film with a mean peak-to-valley height of 1-2 μm. With these capillary forces, silicon nucleation films of up to 10 μm thickness can be maintained over the full surface of the intermediate film without forming droplets. However, film thicknesses of 2-4 μ are preferably used for nucleation.

The film is manufactured in the manner described in the following:

Referring now to FIG. 1, a quartz reactor (3) is used as a CVD reactor, in which a substrate having an electrically conducting intermediate film (1) is located on a graphite holder (2). The intermediate film can be of SiC. The substrate with the intermediate film is inductively heated using a radio-frequency coil (4) to a temperature of approx. 1100° C. $H_2$ and $SiHCl_3$ or $SiCl_4$ is now passed through the previously evacuated and gas-flushed pipe, so that a thin silicon film of 1-10 μm, preferably 4 μm, is deposited as a nucleation film on the hot substrate.

After deposition of the nucleation film, the temperature of the film is raised to 1450° C. (above the melting point of silicon) and the film is melted. Then the film is cooled and solidifies laterally, starting at the four corners and moving inwards (FIG. 1: solidified film (6), molten (5)).

Figure 6:
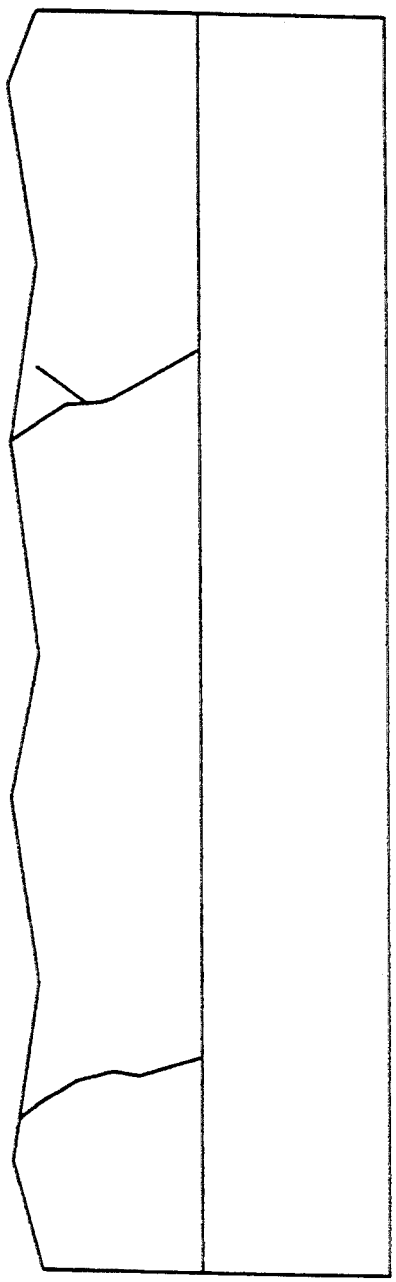
FIG. 6 is a micrograph of a film structure comprising a nucleation film and a semiconductor film.

After complete solidification, the substrate is cooled down to about 1100° C. again. The semiconductor film can now be deposited. In this way, a continuous film structure having grain boundaries perpendicular to the substrate surface and grain sizes of 100 μm-300 μm (see FIG. 6) is obtained.

In principle, this type of manufacture is possible on any material wetted by silicon and with a porosity so low that the material does not soak up the silicon. Any substrate material can be used, which must meet the boundary conditions of a pore-free surface facing the nucleation film, and thermal and chemical stability under high temperatures and against the media used.

To ensure all this and to use less expensive materials for the nucleation, however, the invention provides for covering the substrate surface with a fine-crystalline, dense and electrically conductive SiC film. It is important that the SiC film consists of elongated columnar crystallites with a surface peak-to-valley height of approx. 1-2 μm ($R_A$ value). The film thickness is preferably 20-100 μm, and the peak-to-peak distance approx. 1-5 μm.

The result of the above is two possibilities for achieving the object, which are set forth separately below.
Alternate 1:

There is good adhesion between the SiC intermediate film and the substrate. The substrate then remains underneath the intermediate film and forms the substrate proper. Materials must then be used that have a thermal expansion coefficient as close as possible to silicon ($4 \times 10^{-6} K^{-1}$).

The substrate surface can have a porosity on which high requirements are not placed. A high temperature stability is necessary. The required thermal expansion can be achieved using a mix of at least two components, generally n-components, by homogeneously mixing fine-grained powders with amounts of substance compensating for the divergences in the expansion coefficients from silicon.

Alternate 2:

A further possible solution is to initially deposit a SiC film onto a material, preferably a graphite type, with a thermal expansion coefficient that is clearly different from silicon carbide ($4 \times 10^{-6}$ K$^{-1}$) and is preferably $8-9 \times 10^{-6}$ K$^{-1}$.

Cooling results in the SiC film flaking off. This film can now be used in turn as a substrate material for Si coating. The graphite substrate can then be used again.

The SiC intermediate film seals the mostly porous substrate material and thereby prevents the nucleation film material (liquid silicon) from penetrating into the porous substrate material when the former is melted. In addition, the cavity structure in the $\mu$m range achieved by the roughness ensures a greatly improved wetting of the substrate surface thanks to capillary forces. If this film has sufficient electrical conductivity, an insulator can also be used as the substrate material, which is a precondition for integrated series connection of polycrystalline thin-film modules. Liquid Si films of up to 10 $\mu$m can be maintained evenly without forming droplets. This makes the liquid film thick in comparison with the surface roughness of the substrate, with the result that a low-flaw lateral crystal growth can be achieved in the thin film.

A further improvement of the crystal growth can be achieved by tempering the SiC intermediate film in a BCl$_3$/H$_2$ mixture at high temperatures (1100°–1500° C.), or by doping the SiC intermediate film with boron during deposition. The modification of the SiC surface thereby achieved evens the roughness in the film without a marked change in the peak-to-valley height, thereby permitting the growth of monocrystalline areas of square millimeters in size.

With the apparatus described above and shown in FIG. 1, it is possible to manufacture monocrystalline areas that are several square millimeters in size.

A further improvement is achieved with the apparatus shown in FIG. 2:

The substrate (1) is disposed in a radiation field (8), preferably between two radiation fields, producing a basic temperature of 900°–1350° C. on the substrate.

Inside the radiation field is a quartz tube (3) as the reactor, through which chlorosilane compounds are passed as reaction gases, preferably SiHCl$_3$, SiCl$_4$ and hydrogen in a suitable mix ratio. Intensive air cooling of the quartz reactor (3) ensures that the quartz wall does not heat up too much, so that wall coatings from reaction products are avoided. A preferably curved conducting loop (7) is provided that can be moved over the substrate (1). If a high-frequency or medium-frequency current is passed through the conductor, a narrow zone of the substrate can be inductively heated to temperatures above the Si melting point.

Then a thin silicon nucleation film, 1–10 $\mu$m, preferably 4 $\mu$m, is now deposited at 900°–1350° C., preferably around 1100° C. Then the coil is moved over the nucleation film at a constant speed such that a narrow molten zone crosses the nucleation film. During cooling, the material crystallizes, so that large grains can form. A semiconductor film such as a Si film can now be epitaxially deposited onto the solidified nucleation film.

By designing the HF conducting loop (7) with a curvature (FIG. 3), an additional increase in crystal growth can be achieved by nucleus selection during lateral crystallization. The nucleation film crystallizes during the entire process with a convex solidification contour that can have a defined setting. In FIG. 3, the fine-crystalline Si nucleation film (9), the narrow molten zone (10) and the crystallized nucleation film (11) are identified. The phase boundary (transition (10) to (11)) is convex in shape. This is a substantial difference from Chu et al., *J. Appl. Phys.* 48 (1977) 3576, wherein a concave solidification contour is generated because of the convex molten zone. A convex solidification contour is essential for stable crystal growth.

Using this apparatus, it is now possible to manufacture a component such as a solar cell or a semiconductor structure such as substrate/rear contact/p-Si film/n-Si film. First the quartz tube is evacuated and flushed. Then the substrate coated with the rear contact material is inserted into the reactor and heated up to 900°–1350° C. using radiation-type heating. After admitting the reaction gases H$_2$, SiHCl$_3$, BCl$_3$, a thin nucleation film is deposited onto the substrate.

The nucleation film is then melted by a zone-based melting operation and slowly crystallized with a convex solidification contour. A thick multicrystalline p-doped Si film is deposited onto the nucleation film. Then the chamber is evacuated and re-flooded, and a phosphorus-doped n-conducting film (0.1 $\mu$m to several $\mu$m in thickness) is deposited. This semiconductor film is cooled in a defined manner. Then the sample is provided with a screen-printed front lattice-shaped electrode.

A back surface field is manufactured by high doping of the nucleation film with boron, for reducing the recombination of charge carriers at the boundary surface between the epitaxial film and the nucleation film.

The nucleation film is also used for picking up impurities from the substrate.

Figure 4:
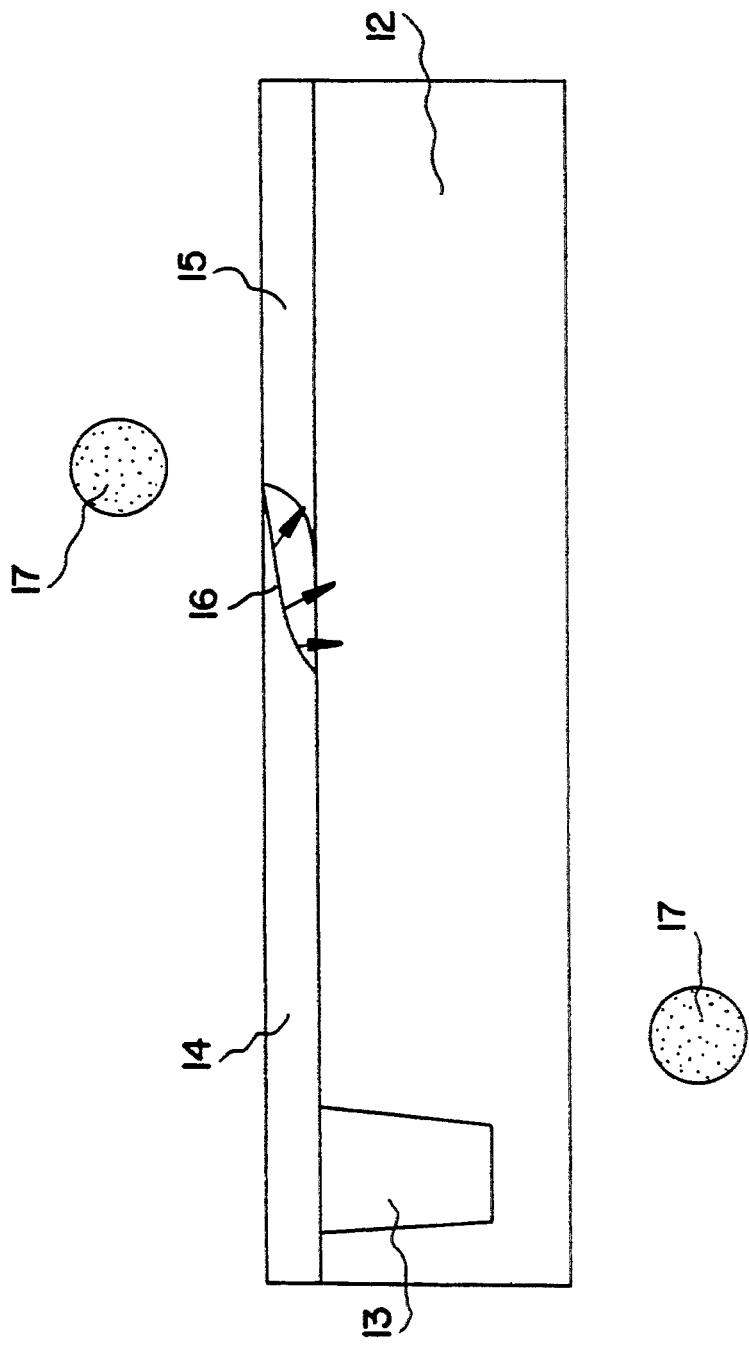
FIG. 4 is a sketch showing the principle of the recrystallization process.

A selective orientation of the nucleation film is possible by introducing small quantities of monocrystalline material into the substrate (FIG. 4). A monocrystalline nucleus (13) with (100)-orientation is inserted into the substrate such that its surface is flush with the substrate surface. After the basic temperature of around 1000° C. is reached, the carrier including the Si nucleus (13) is coated with the thin Si nucleation film. Then the induction coil (17) is moved over the substrate and the nucleation film is melted. Due to the higher electrical conductivity of the molten Si nucleation film (15), the nucleation film is about 100° C. hotter than the substrate because of the greater input of electrical energy. The process is controlled such that the nucleus is only partially melted in view of its small diameter and because of the cooling effect of the substrate.

During solidification, the orientation of the nucleus can then become effective for the crystallizing nucleation film. With this method, it is also possible to achieve monocrystalline oriented nucleation films (14) on polycrystalline substrates (12).

Further cleaning of the nucleation film (14) and hence of the following epitaxial semiconductor film is achieved by controlling the lateral solidification process such that the solidification contour (16) is not perpendicular to the substrate surface, but at a shallow angle, with the Si nucleation film first solidifying at the surface.

This is achieved by positioning the conducting loop—(7) in FIG. 3 and (17) in FIG. 4—at an angle or designing in convex form only that part which is above the film (FIG. 3). Flaws on the substrate no longer have any effect on the surface of the nucleation film, which is a precondition for monocrystalline film growth. In addition, impurities with a distribution coefficient of less than 1 are concentrated at the silicon/substrate boundary surface (or rear contact) and not in the film.

By selecting a suitable basic orientation of the nucleation film (e.g. 100 or 111 orientation), the epitaxial film can be provided with a texture, which is an advantage for solar cells.

FIG. 7 shows the pyramidal growth of a surface of this type. In these pyramids, the light is captured and deflected better, which in turn leads to improved light absorption.

Figure 5:
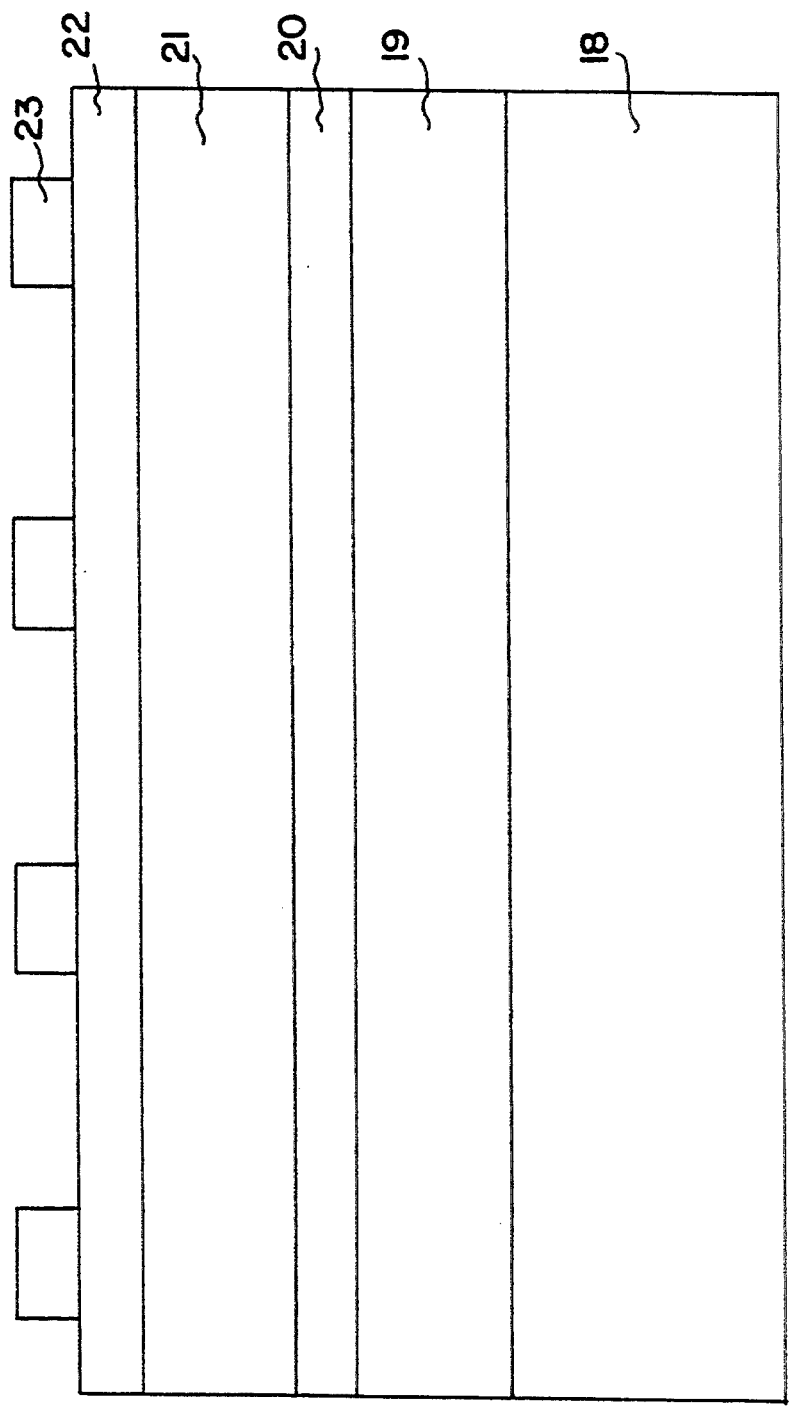
FIG. 5 shows the structure of a semiconductor component.

FIG. 5 shows the film structure of a thin-film solar cell made using the method described. In the figure, (18) is the substrate (graphite or ceramic). Onto this substrate there is deposited an electrically conducting SiC intermediate film (19), which is preferably 20–100 $\mu$m thick, p-conducting, has a surface roughness of 1–2 $\mu$m, and serves at the same time as a sealing film, a diffuse reflector, and a rear contact.

The thin nucleation film (20), which is preferably 4 $\mu$m thick, p-conducting and highly doped, is formed above this. Then the photovoltaically sensitive epitaxial film (21) (film thickness 5 $\mu$m to 400 $\mu$m, preferably 10–30 $\mu$m) is deposited on it. Above this is the n-film (22) and the front contact (23). Instead of the film (22), an MIS inversion film solar cell can be manufactured on the epitaxial film (21).

Although the theory in accordance with the invention has been described above on the basis of a thin-film solar cell, semiconductor components such as photodetector or thin-film transistor arrays can also be manufactured in accordance with the invention.

We claim:

1. A solar cell comprising a substrate, and the following layers deposited thereon in the order recited: an intermediate film deposited on a surface of said substrate and sealing the surface thereof, said intermediate film containing polycrystalline silicon carbide, a nucleation film having a monocrystalline or multicrystalline structure deposited on said intermediate film, at least one semiconductor film deposited on said intermediate film, first and second electrically conducting contacts forming front and rear contacts, respectively, and said intermediate film comprising said second contact.

2. A solar cell as set forth in claim 1 in which the thickness of said nucleation film is up to 10 $\mu$m.

3. A solar cell as set forth in claim 1 in which the surface on which said nucleation film is deposited is roughened, such that, when said nucleation film is deposited, the adhesion forces between it and the surface on which it is deposited are greater than the cohesion forces of the material of which the nucleation film material is composed.

4. A solar cell as set forth in claim 1 in which said polycrystalline silicon carbide contains polycrystalline silicon.

5. A solar cell as set forth in claim 1 in which said intermediate film is doped with a member of the group consisting of boron, aluminum, nitrogen, and phosphorus.

6. A solar cell as set forth in claim 1 in which said intermediate film has a lower refractive index than said semiconductor film.

7. A solar cell as set forth in claim 1 in which said intermediate film has a specific resistance of less than 100 $\Omega$cm.

8. A solar cell as set forth in claim 1 in which intermediate film has a specific resistance of less than 0.01 $\Omega$cm.

9. A solar cell as set forth in claim 1 in which said intermediate film containing silicon carbide is supplemented by an electrically conductive metal boride, metal carbide, or metal nitride.

10. A solar cell as set forth in claim 1 in which the substrate has a thermal expansion coefficient similar to the thermal coefficient of silicon.

11. A solar cell as set forth in claim 1 in which said substrate comprises high-purity, isostactically compressed graphite of a thickness D, where 50 $\mu$m<D<5 mm.

12. A solar cell as set forth in claim 1 in which said substrate comprises high-purity, isostactically compressed graphite of a thickness D, where 200 $\mu$m<D<500 $\mu$m.

13. A solar cell as set forth in claim 1 in which said substrate is a material composed of ceramic constituents.

14. A solar cell as set forth in claim 1 in which said substrate is a homogeneous, isotropic ceramic material having at least two components, wherein the components have thermal expansion coefficients differing from each other and from silicon, and wherein said components are mixed and sintered in a ratio such that the resultant overall thermal expansion coefficient is approximately equal to that of silicon.

15. A method for the manufacture of a solar cell comprising a substrate, an intermediate film deposited on a surface of said substrate and sealing the surface thereof, said intermediate film containing polycrystalline silicon carbide, a nucleation film having a monocrystalline or multicrystalline structure deposited on said intermediate film, at least one semiconductor film deposited on said nucleation film, first and second electrically conducting contacts forming front and rear contacts, respectively, and said intermediate film comprising said second contact, said method comprising first depositing said nucleation film, subsequently crystallizing said nucleation film, and then depositing said semiconductor film on said nucleation film, the materials used for said intermediate film and said nucleation film being such that adhesion forces exist between the nucleation film and the intermediate film which are greater than the cohesion forces of the material forming said nucleation film.

16. A method as set forth in claim 15 including subjecting said nucleation film to lateral crystallization in which said nucleation film is melted, such that, in a plane parallel to said substrate, a convex-shaped solidification contour is obtained between the crystallized nucleation film and the molten part of part of said nucleation film.

17. A method as set forth in claim 16 including initiating melting of said nucleation film in a projecting area of said convex-shaped solidification contour.

18. A method as set forth in claim 16 including initiating melting of said nucleation film in a corner area of said nucleation film.

19. A method as set forth in claim 15 including inserting an oriented nucleus into said substrate, and partially melting said oriented nucleus while depositing and melting said nucleation film, whereby oriented lateral crystal growth takes place in said nucleation film.

20. A method as set forth in claim 15 including roughening the surface on which said nucleation film is deposited prior to depositing said nucleation film.

21. A method as set forth in claim 15 including solidifying said nucleation film laterally with a temperature gradient inclined in the direction of the substrate.

22. A method as set forth in claim 21 in which the nucleation film is solidified laterally in such a way that impurities in the nucleation film are concentrated between said nucleation film and said substrate.

23. A method as set forth in claim 15 including orienting said nucleation film such that said semiconductor film is epitaxially deposited with a textured surface.

24. A method as set forth in claim 15 including tempering said intermediate film in a mixture of hydrogen and at least one volatile boron compound, prior to depositing said nucleation film.

25. A method as set forth in claim 15 including tempering said intermediate film in a mixture of hydrogen and at least one volatile boron compound selected from the group consisting of $BBr_3$, $B_2H_6$, and $BCl_2$, prior to deposition of said nucleation film.

26. A method as set forth in claim 15 including depositing said intermediate film onto said substrate at a temperature $T_1$, said substrate and said intermediate film having different thermal coefficients of expansion, cooling said intermediate film to a temperature $T_2$, and then using material flaking off during the process as a substrate for said semiconductor component.

* * * * *